(12) United States Patent
Zhai et al.

(10) Patent No.: US 11,108,021 B2
(45) Date of Patent: Aug. 31, 2021

(54) DISPLAY PANEL AND DISPLAY APPARATUS

(71) Applicant: Shanghai Tianma Micro-Electronics Co.,Ltd., Shanghai (CN)

(72) Inventors: Yingteng Zhai, Shanghai (CN); Feng Lu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/815,551

(22) Filed: Mar. 11, 2020

(65) Prior Publication Data
US 2021/0193959 A1 Jun. 24, 2021

(30) Foreign Application Priority Data

Dec. 20, 2019 (CN) .......................... 201911325275.1

(51) Int. Cl.
*G06F 3/045* (2006.01)
*H01L 51/52* (2006.01)
*G06F 3/044* (2006.01)
*H01L 27/32* (2006.01)

(52) U.S. Cl.
CPC ........ *H01L 51/5253* (2013.01); *G06F 3/0443* (2019.05); *G06F 3/0446* (2019.05); *H01L 27/323* (2013.01); *H01L 27/3244* (2013.01)

(58) Field of Classification Search
CPC ........ G06F 3/041; G06F 3/044; G06F 3/0412; G06F 2203/04103; G06F 3/016; G06F 3/0488; G06F 3/04883; G06F 3/03545; G06F 3/0446; G06F 1/163
See application file for complete search history.

(56) References Cited

U.S. PATENT DOCUMENTS

2009/0189866 A1* 7/2009 Haffenden ............ G06F 3/0443
345/173
2013/0328803 A1* 12/2013 Fukushima ....... H04M 1/27475
345/173

(Continued)

FOREIGN PATENT DOCUMENTS

| CN | 107885390 A | 4/2018 |
|---|---|---|
| CN | 108539040 A | 9/2018 |
| CN | 109300913 A | 2/2019 |

*Primary Examiner* — Olga V Merkoulova
(74) *Attorney, Agent, or Firm* — Christensen O'Connor Johnson Kindness PLLC

(57) ABSTRACT

The present disclosure provides a display panel and a display apparatus. The display panel includes a substrate, an array layer located on the substrate, a display layer located on a side of the array layer facing away from the substrate and comprising light-emitting components, a thin film encapsulation layer located on a side of the display layer facing away from the array layer; and at least one stress detection portion extending to a region overlapping with and in contact with the thin film encapsulation layer from a region outside the thin film encapsulation layer and not overlapping with the thin film encapsulation layer. Through the stress detection section, the strain of the edge portion of the thin film encapsulation layer can be accurately evaluated. With a pinned structure, the encapsulation structure can be strengthened and the encapsulation reliability can be enhanced.

17 Claims, 13 Drawing Sheets

(56) References Cited

U.S. PATENT DOCUMENTS

| | | | | |
|---|---|---|---|---|
| 2014/0118635 A1* | 5/2014 | Yang | ................. | G06F 3/0446 349/12 |
| 2014/0139444 A1* | 5/2014 | Kauhanen | ............. | G06F 3/0445 345/173 |
| 2014/0174190 A1* | 6/2014 | Kulkarni | ................ | G01L 1/20 73/774 |
| 2014/0352447 A1* | 12/2014 | Yoshikawa | ............ | G01L 1/183 73/774 |
| 2015/0301684 A1* | 10/2015 | Shimamura | ......... | G06F 3/04186 345/174 |
| 2015/0331517 A1* | 11/2015 | Filiz | ...................... | G06F 3/044 345/173 |
| 2015/0340652 A1* | 11/2015 | Oh | ........................ | H01L 51/56 257/40 |
| 2016/0062517 A1* | 3/2016 | Meyer | ................ | G06F 3/04144 345/173 |
| 2016/0139717 A1* | 5/2016 | Filiz | ........................ | G01L 1/18 345/173 |
| 2016/0357297 A1* | 12/2016 | Picciotto | ............... | G06F 3/038 |
| 2017/0023420 A1* | 1/2017 | Vosgueritchian | ....... | G06F 3/045 |
| 2018/0006265 A1* | 1/2018 | Oh | ..................... | H01L 51/0017 |
| 2018/0020841 A1* | 1/2018 | Mitsuzuka | ............ | A47C 31/00 5/737 |
| 2018/0129330 A1* | 5/2018 | Ding | .................... | G06F 3/0443 |
| 2018/0249939 A1* | 9/2018 | Huang | ................ | A61B 5/0205 |

\* cited by examiner

DISPLAY PANEL AND DISPLAY APPARATUS

CROSS-REFERENCE TO RELATED APPLICATIONS

The present disclosure claims priority to Chinese Patent Application No. 201911325275.1, filed on Dec. 20, 2019, the content of which is incorporated herein by reference in its entirety.

FIELD

The present disclosure relates to the field of display, and particularly, to a display panel and a display apparatus including the display panel.

BACKGROUND

With the continuous development of display technologies, the display panel manufacturing technology has advanced. However, light-emitting devices of some display panels are sensitive to oxygen and water vapor that cause defects such as black spots, pinholes, and chemical reactions of organic materials once oxygen and water vapor penetrate into the display panel. These defects may negatively affect service life of the display panel. A thin film encapsulation (TFE) method is usually adopted to encapsulate the display devices in the display panel, so as to prevent external moisture, oxygen and other impurities from entering the interior of the display panel. In this way, the service life of the display panel is not affected by the oxidation of the devices inside the display panel. Therefore, the encapsulation layer should have good reliability.

SUMMARY

In view of the above, a first aspect of the present disclosure provides a display panel. The display panel includes a substrate, an array layer located on the substrate, a display layer located on a side of the array layer facing away from the substrate and including light-emitting components, a thin film encapsulation layer located on a side of the display layer facing away from the array layer, and at least one stress detection portion. The at least one stress detection portion extends from a region outside the thin film encapsulation layer and not overlapping with the thin film encapsulation layer to a region overlapping with and in contact with the thin film encapsulation layer.

A second aspect of the present disclosure provides a display apparatus including the display panel according to the first aspect.

DESCRIPTION OF EMBODIMENTS

Figure 1:
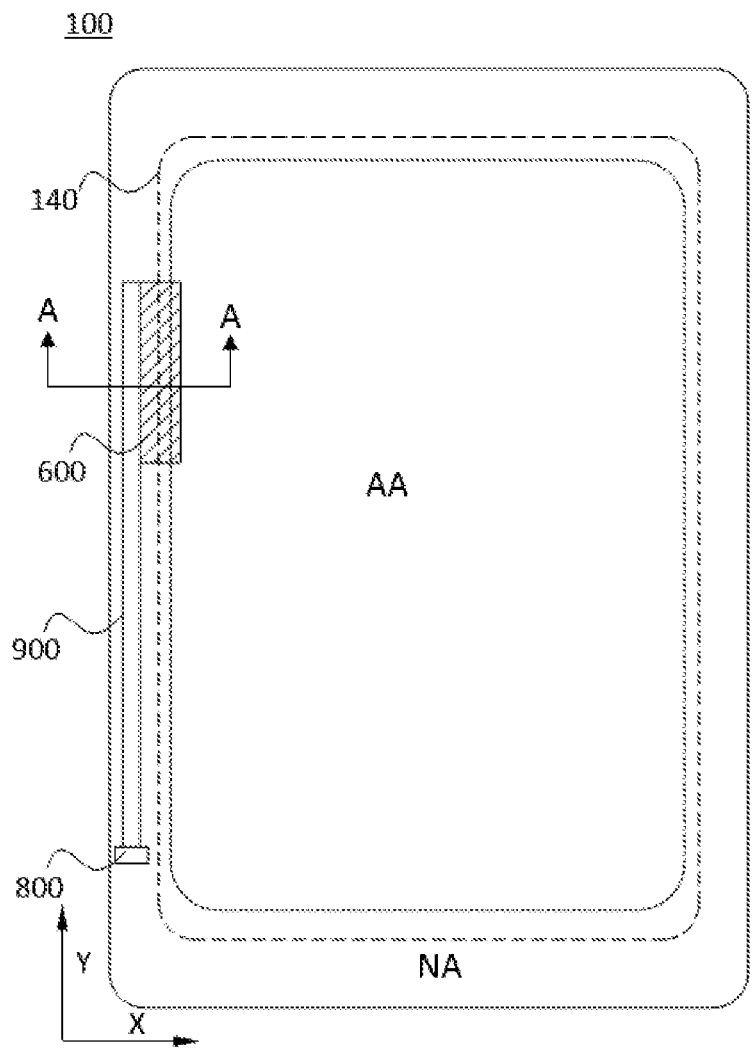
FIG. 1 is a top view of a display panel according to an embodiment of the present disclosure.

In order to explain the foregoing objects, features, and advantages of the present disclosure, the inventive technology is described in detail with reference to the drawings and embodiments.

It should be noted that specific details are set forth in the following description for illustrating the present disclosure. However, the present disclosure can be implemented in various manners other than those specifically described herein, and those skilled in the art can make similar modification without departing from the spirit of the present disclosure. Therefore, the present disclosure is not limited to the specific embodiments disclosed below.

The terms used in the embodiments of the present disclosure are for the purpose of describing specific embodiments, but not intended to limit the present disclosure. The singular forms "a", "an" and "the" used in the embodiments of the present disclosure and the pending claims may also indicate plural forms, unless clearly described otherwise in the context.

It should be noted that terms describing positions and orientations, such as "on", "under", "left", "right", in the embodiments of the present disclosure are described from the angle shown in the drawings, and shall not be understood as limitations of the embodiments of the present disclosure. In addition, it should be understood that, when a component is described as formed "on" or "under" another component, the component can be formed directly on or under another component, and can also be indirectly formed on or under another component through an intermediate component.

As used herein, the expression "at least one of A or B" and includes the following: A alone, B alone, and A and B. Unless stated otherwise, one or more features of any embodiment may be combined with one or more features of one or more other embodiments to form additional embodiments.

Exemplary embodiments can be implemented in various manners, and should not be construed as limitations of the present disclosure. These embodiments are provided to explain the present disclosure and convey the concepts of the exemplary embodiments comprehensively to those skilled in the art. The same or similar structures are denoted with same reference numerals in the drawings, and the descriptions thereof will not be repeated. The terms describing positions and directions in the present disclosure, which are used in view of the drawings, may vary according to the actual situations, which also fall within the protection scope of the present disclosure. The drawings of the present disclosure are only used to illustrate the relative positional relationships. The layer thicknesses of some parts are exaggerated for purpose of explaining. The drawings are not intended to show the proportional relationships of the actual layer thicknesses. In case of no conflict, the embodiments of the present disclosure and the features in the embodiments can be combined with one another. In addition, the same features of different embodiments will not be repeatedly described.

Figure 2:
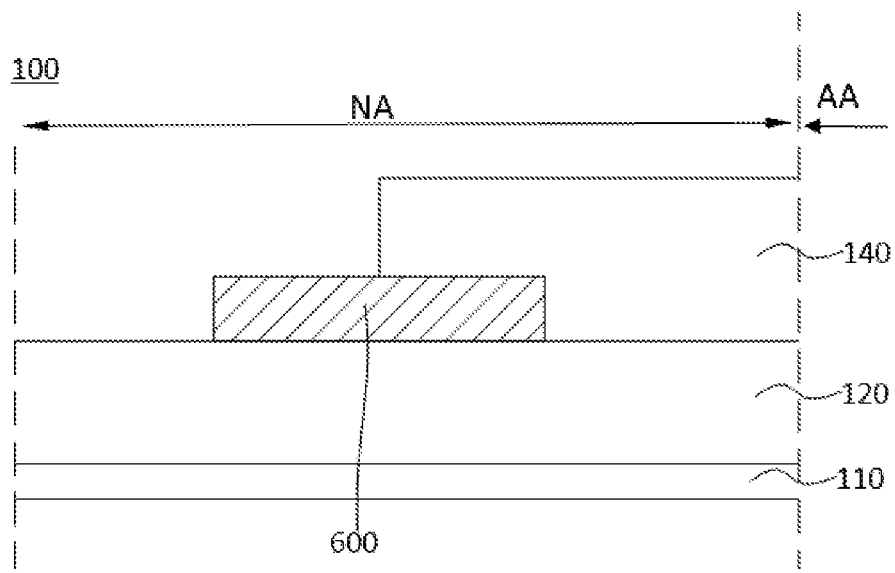
FIG. 2 is a cross-sectional view taken along A-A in FIG. 1.

FIG. 1 is a top view of a display panel according to an embodiment of the present disclosure, and FIG. 2 is a cross-sectional view taken along A-A in FIG. 1. As shown in FIG. 1 and FIG. 2, the cross section is perpendicular to a plane of the display panel and parallel to a direction in which a display area of the display panel points to a non-display area of the display panel. Stated differently, the cross section is perpendicular to the plane of the display panel and perpendicular to a direction along which an edge of the display panel extends in the top view.

In an embodiment, the display panel 100 is divided into a display area AA and a non-display area NA surrounding the display area AA. It can be understood that a dotted frame in FIG. 1 indicates the boundary between the display area AA and the non-display area NA. The display area AA is an area of the display panel for displaying images, and includes a plurality of pixel units arranged in an array. Each pixel unit includes a corresponding light-emitting device (e.g., a diode) and a corresponding control element (e.g., a thin film transistor that constitutes a pixel driving circuit). The non-display area NA surrounds the display area AA and includes peripheral driving elements, peripheral wirings, and fan-out regions.

In an embodiment, the display panel 100 includes, in such a sequence, a substrate 110, an array layer 120, a display layer (not shown), and a thin-film encapsulation layer 140.

The substrate 110 may be made of, for example, glass, polyimide (PI), polycarbonate (PC), polyethersulfone (PES), polyethylene terephthalate (PET), polyethylene naphthalate (PEN), polyarylates (PAR), glass fiber reinforced plastics (FRP), or other polymer materials. The substrate 110 may be transparent, translucent, or opaque.

The array layer 120 that is disposed on the substrate 110 includes pixel circuits configured to control light-emitting components.

The display layer, which is disposed on a side of the array layer 120 facing away from the substrate 110, includes the light-emitting components for displaying images. The light-emitting components are mainly located in the display area AA.

The thin film encapsulation layer 140 is located on a side of the display layer facing away from the array layer 120. The thin film encapsulation layer 140 is configured to encapsulate the display layer. That is, the peripheral edges of the thin film encapsulation layer 140 are in contact with the array layer 120 to seal the light-emitting components. In an embodiment, the thin film encapsulation layer 140 completely covers the entire display area AA and extends from the display area AA to the non-display area NA, and is in contact with the array layer 120 in the non-display area NA.

The display panel 100 further includes at least one stress detection portion 600. The stress detection portion 600 extends from a region that is outside the thin film encapsulation layer 140 and that does not overlap with the thin film encapsulation layer 140, to a region overlapping with the thin film encapsulation layer 140 and in contact with the thin film encapsulation layer 140.

That is, the stress detection portion 600 is located in the non-display area NA, and extends from an edge of the display panel 100 towards the thin film encapsulation layer 140 and further to the region where it overlaps with and contacts the thin film encapsulation layer 140. Therefore, the stress detection portion 600 at least partially overlaps with an end surface of the thin film encapsulation layer 140, and at least partially overlaps with and contacts one of the side surfaces of the thin film encapsulation layer 140. In other words, the stress detection portion extends from a part of the surface of the array layer uncovered by the thin film encapsulation layer to the region overlapping with the thin film encapsulation layer, and the portion of the detection resistor overlapping with the thin film encapsulation layer is in contact with the thin film encapsulation layer.

It can be understood that the term "overlapping" as used herein means overlapping in a direction perpendicular to the plane of the display panel, i.e., overlapping of orthographic projections on the plane of the display panel.

It should be noted that the thin film encapsulation layer 140 has a lower surface and an upper surface that are opposite to each other and are both parallel to the plane of the display panel 100, i.e., the two side surfaces of the thin film encapsulation layer 140 mentioned above. The thin film encapsulation layer 140 also has end surfaces, and each end surface connects the two side surfaces of the thin film encapsulation layer 140. The end surfaces intersect the plane of the display panel 100. In some embodiments, the end surfaces of the thin film encapsulation layer 140 are substantially perpendicular to the plane of the display panel.

In addition, the area enclosed by the dashed line in FIG. 1 is an area covered by the thin film encapsulation layer 140, and the dash line can be understood as the boundary of the thin film encapsulation layer 140. It can be understood that there is a non-zero gap between the edge of the thin film encapsulation layer and the edge of the display panel in this application. The edge of the thin film encapsulation layer is determined by a photolithography process. In some embodiments, the thin film encapsulation layer includes an inorganic encapsulation layer, and the dashed line can be understood as a boundary of the inorganic encapsulation layer.

In view of the above embodiments, a stress change of the thin film encapsulation layer can be detected more accurately. As the stress detection portion extends from the region outside the thin film encapsulation layer 140 and not overlapping with the thin film encapsulation layer to the region overlapping with the thin film encapsulation layer and in contact with the thin film encapsulation layer, the stress detection section can function along an extension route of a potential crack, and thus the detection results are more accurate. In addition, the stress detection portion overlaps with an area which is not covered by the thin film encapsulation layer, and also overlaps with one end surface and one side surface of the thin film encapsulation layer in an area covered by the thin film encapsulation layer, so that the stress detection portion can specifically detect stress in the risky area.

The above embodiments illustrate the stress detection portion located between the thin film encapsulation layer and the array layer, butt the present disclosure is not limited thereto. In other embodiments of the present application, the stress detection portion may be located at a side of the thin film encapsulation layer facing away from the array layer.

Figure 3:
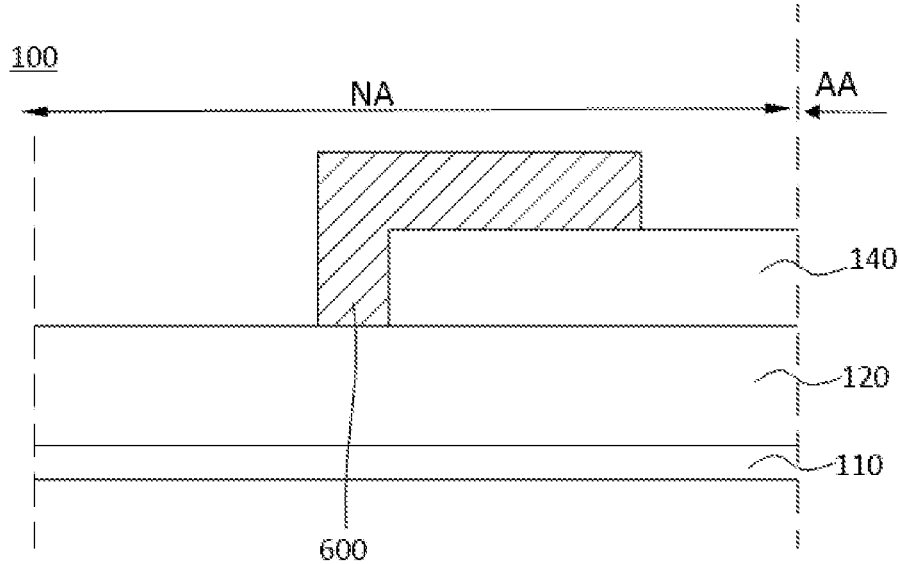
FIG. 3 is a schematic cross-sectional view of a display panel according to another embodiment of the present disclosure.

FIG. 3 is a schematic cross-sectional view of another display panel according to an embodiment of the present disclosure. For example, as shown in FIG. 3, the stress detection portion 600 is located on the side of the thin film encapsulation layer 140 facing away from the array layer 120. In this way, on the one hand, the contact area between the thin film encapsulation layer 140 and the array layer 120 is increased, so as to block intrusion path for water and oxygen; and on the other hand, the stress detection portion 600 wraps around an end surface of the thin film encapsulation layer 140, so as to improve detection of the stresses at different positions of the thin film encapsulation layer 140, thereby improving the detection accuracy. A portion of the stress detection portion 600 may be located in and adhesively bonded to a part of area of the array layer uncovered by the thin film encapsulation layer; and another portion of the stress detection portion 600 may extend to the thin film encapsulation layer, where it overlaps with and adhesively bonds to the thin film encapsulation layer. In this way, the bonding force between the thin film encapsulation layer 140 and the array layer 120 is increased, and the encapsulation structure is reinforced. Further, since the contact interface between the thin film encapsulation layer 140 and the array layer 120 is covered by the stress detection portion 600, the ability of blocking water and oxygen is improved.

In an embodiment, the stress detection portion 600 is a stress detection resistor. The stress detection resistor can convert a deformation (strain) or force which it is subjected to into a change in resistance value, thereby measuring force, pressure, and/or stress.

In some embodiments, the stress detection portion is made of a metal material. On the one hand, such stress detection portion can have good uniformity and is not easy to break, thereby preventing breakage of the stress detection portion before the stress causes occurrence of the crack. On the other hand, the metal layer is inserted into the encapsulation layer, and the metal can play a role of preventing cracks.

In some embodiments, the stress detection portion is a brittleness detection resistor.

For example, the stress detection portion may be made of a non-metal material such as Si, Mo, Ti, etc. These materials have high sensitivity and thus can provide accurate detection results.

In an embodiment, the brittleness detection resistance is made of a material that will break when the strain is smaller than or equal to 1%.

In this embodiment, the appearance of the crack is reflected by an open circuit caused by a breakage of the brittleness detection resistor itself, i.e., an open circuit of the detection device indicates a warning. At the same time, the breakage of the brittleness detection resistor itself can relieve the stress. That is, a part of the stress concentrated on the thin film encapsulation layer can be released by mean of the breakage of the brittleness detection resistor. In other words, in the present embodiment, the brittleness detection resistor can detect the stress and crack, and can also release the stress in the region where the stress may be highly concentrated.

Figure 4:
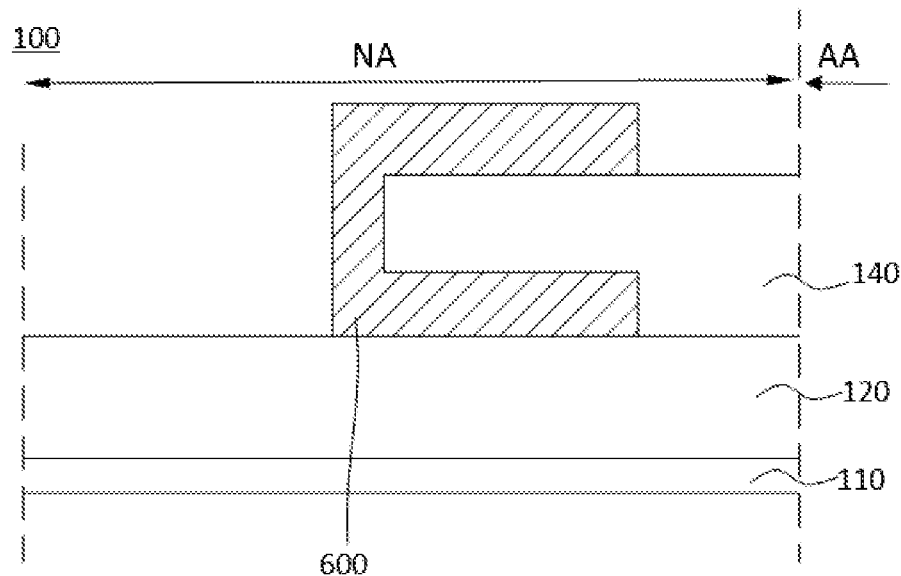
FIG. 4 is a schematic cross-sectional view of another display panel according to an embodiment of the present disclosure.

FIG. 4 is a schematic cross-sectional view of another display panel according to an embodiment of the present disclosure.

The embodiment shown in FIG. 4 differs from the above embodiments in that the stress detection portion includes a first detection sub-portion and a second detection sub-portion that are located in different layers.

In an embodiment, the stress detection portion includes a plurality of first detection sub-portions and a plurality of second detection sub-portions electrically connected to the plurality of first detection sub-portions. That is, in the same stress detection section, the first detection sub-portions are located in a different layer from the second detection sub-portions, but they are electrically connected to the second detection sub-portions. In an embodiment, the first detection sub-portion and the second detection sub-portion are connected in series. In this way, the stress and the risk of a crack at different thicknesses or layer positions of the thin film encapsulation layer can be detected simultaneously.

Figure 5:
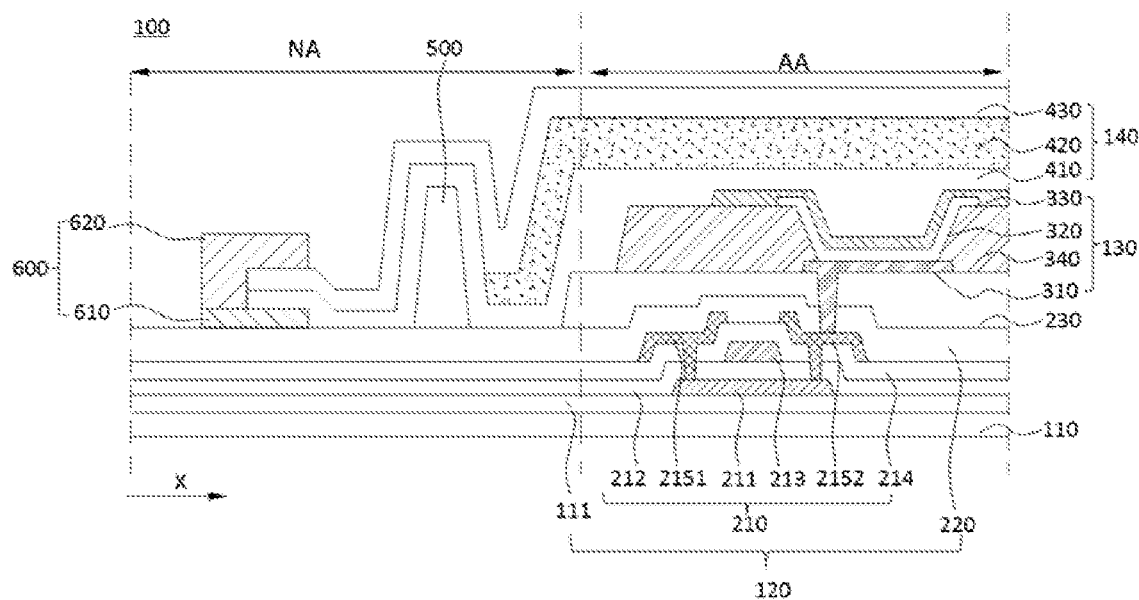
FIG. 5 is a cross-sectional view of still another display panel taken along A-A in FIG. 1 according to an embodiment of the present disclosure.

In some embodiments, the first detection sub-portion and the second detection sub-portion are respectively located on two opposite side surfaces of the thin film encapsulation layer 140. FIG. 5 is a cross-sectional view of another display panel along A-A in FIG. 1 according to an embodiment of the present disclosure. For example, in combination with FIG. 4 and FIG. 5, the display panel 100 includes, in such a sequence, a substrate 110, an array layer 120, a display layer 130, and a thin film encapsulation layer 140.

The array layer 120 disposed on the substrate 110 includes a plurality of thin film transistors (TFTs) 210 that constitute a pixel circuit configured to control the light-emitting components.

The present embodiment is directed to a top-gate type of thin film transistor as an example. The thin film transistor layer 210 includes an active layer 211 located on the substrate 110, a gate insulating layer 212 located on the active layer 211, a gate electrode 213 located on the gate insulating layer 212, an interlayer insulating layer 214 located on the gate electrode 213, and a source electrode 2151 and a drain electrode 2152 located on the interlayer insulating layer 214.

The active layer 211 may be made of an amorphous silicon material, a polysilicon material, a metal oxide material, or the like. The active layer 211 may include a source region and a drain region that are formed by doping N-type or P-type impurity ions, as well as a channel region formed between the source region and the drain region.

The gate insulating layer 212 includes an inorganic layer such as silicon oxide and silicon nitride, and can be a single layer or multiple layers.

The gate electrode 213 may include single or multiple layers of gold (Au), silver (Ag), copper (Cu), nickel (Ni), platinum (Pt), palladium (Pd), aluminum (Al), molybdenum (MO), or chromium (Cr); or alloys, such as aluminum (Al): neodymium (Nd) alloy and molybdenum (MO): tungsten (W) alloy.

The interlayer insulating layer 214 may be formed by insulating an inorganic layer of silicon oxide, silicon nitride or the like. In other embodiments of the present disclosure, the interlayer insulating layer may be made of an organic insulating material.

The source electrode 2151 and the drain electrode 2152 are electrically connected (or combined) to the source region and the drain region through contact holes, respectively. The contact holes (also referred to as via holes) are formed by selectively removing the gate insulating layer 212 and the interlayer insulating layer 214.

It can be understood that a film layer located "on" another film layer in this embodiment can be understood as "on a side facing away from the substrate".

In an embodiment, the array layer 120 may further include a buffer layer 111, which is located on a side of the array layer 120 that is in contact with the substrate 110. In some embodiments, the buffer layer 111 may be a part of the substrate 110.

In an embodiment, the buffer layer 111 may have a stacked structure including inorganic and organic layers for blocking oxygen and moisture, so as to prevent moisture or impurities from diffusing through the substrate, and to provide a flat surface on the upper surface of the substrate 110. A specific structure thereof will not be repeated herein.

In an embodiment, the array layer 120 further includes a passivation layer 220 located on the thin film transistor 210. The passivation layer 220 may be formed of an inorganic layer of silicon oxide, silicon nitride or the like, or an organic layer.

In an embodiment, the buffer layer, the gate insulating layer, the interlayer insulating layer, and the passivation layer may extend from the display area to the non-display area, or even to a cutting edge of the display panel.

In an embodiment, the display panel 100 further includes a planarization layer 230 located on the array layer 120. An anode 310 may include an organic layer of acrylic, polyimide (PI), benzocyclobutene (BCB) or the like. The planarization layer 230 has a planarization effect.

The display layer 130 is located on a side of the array layer 120 facing away from the substrate 110.

In an embodiment, the display layer 130 includes an organic light-emitting device. The organic light-emitting device includes an anode 310, an organic light-emitting material 320, and a cathode 330, which are sequentially disposed in a direction facing away from the substrate 110. The anode 310 includes anode patterns corresponding to the pixel units in one to one correspondence. The anode pattern in the anode 310 is connected to the source electrode 2151 or the drain electrode 2152 of the thin film transistor 210 through a via hole in the anode 310.

The display layer 130 further includes a pixel definition layer 340 on a side of the anode layer 310 facing away from the array layer 120. The pixel definition layer 340 may be made of an organic material such as polyimide (PI), polyamide, benzocyclobutene (BCB), acrylic resin, or phenolic resin; or it may be made of an inorganic material such as SiNx.

In an embodiment, the organic light-emitting device is defined by an opening of the pixel definition layer 340 and is located in the display area AA. For example, the pixel definition layer 340 includes a plurality of openings exposing the anode 310, and the pixel definition layer 340 covers edges of the pattern of the anode 310. The organic light-emitting material 320 is at least partially filled in the openings of the pixel definition layer 340 and is in contact with the anode 310. The organic light-emitting material 320 in each opening of the pixel definition layer 340 forms a smallest light-emitting unit. Each light-emitting unit can emit light of a different color depending upon the different organic light-emitting materials 320. Each light-emitting unit in communication with the pixel circuit forms a pixel. The plurality of pixels operates together to display images.

In other embodiments of the present disclosure, the organic light-emitting device may be a LED or other self-luminous device, or the organic light-emitting device may be an image display apparatus of other mechanisms.

In an embodiment, the display panel 100 may further include a thin film encapsulation layer (TFE) 140 located on the display layer 130, i.e., on a side of the display layer 130 facing away from the array layer 120, the thin film encapsulation layer 140 completely covering and sealing the display layer 130.

In an embodiment, the thin film encapsulation layer 140 is located on the cathode layer 330, and the thin film encapsulation layer 140 includes at least one inorganic encapsulation layer. The inorganic encapsulation layer covers the display area AA, and extends from the display area AA to the non-display area NA, and even to a position maintained at a certain distance from the cutting edge of the display panel 100.

In an embodiment, the stress detection portion includes a first detection sub-portion 610 and a second detection sub-portion 620 electrically connected to the first detection sub-portion 610; and the first detection sub-portion 610 and the second detection sub-portion 620 are arranged at different layers.

In an embodiment, the first detection sub-portion 610 and the second detection sub-portion 620 are located on two opposite side surfaces of the thin film encapsulation layer 140, respectively.

Further, as shown in FIG. 5, the thin film encapsulation layer 140 includes a first inorganic encapsulation layer 410, a first organic encapsulation layer 420, and a second inorganic encapsulation layer 430 that are sequentially disposed along the direction facing away from the substrate 110.

In other embodiments of the present disclosure, the thin film encapsulation layer 140 may include other numbers of organic and inorganic material layers stacked as required, as long as it includes at least one organic material layer and at least one inorganic material layer that are alternately arranged where the lowermost layer and the uppermost layer are made of an inorganic material.

In an embodiment, the first inorganic encapsulation layer 410 and the second inorganic encapsulation layer 430 cover the display area AA, extending from the display area AA to the non-display area NA, or even extending to a position at a certain distance from the cutting edge of the display panel 100.

In an embodiment, the display panel 100 further includes a blocking wall 500 disposed in the non-display area NA. In an embodiment, the barrier wall 500 is disposed on the passivation layer 220, for example, between the passivation layer 220 and the thin film encapsulation layer 140. An orthographic projection of the barrier wall 500 on the substrate 110 surrounds the planarization layer 230. In other words, the edge of the orthographic projection of the planarization layer 230 on the substrate 110 is located on a side of the blocking wall 500 that is close to the display area AA. The first organic encapsulation layer 420 is located within a region surrounded by the blocking wall 500. The blocking wall 500 prevents an overflow of the organic material in the thin film encapsulation layer 140. That is, a contour of the edge of the entire thin film encapsulation layer 140 is defined by the first inorganic encapsulation layer 410 and the second inorganic encapsulation layer 430.

In an embodiment, the first detection sub-portion 610 is at least partially located between the first inorganic encapsulation layer 410 and the array layer 120; and the second detection sub-portion 620 is at least partially located on a side surface of the second inorganic encapsulation layer 430 facing away from the first inorganic encapsulation layer 410.

The display panel known in the related art cannot monitor the edge of the thin film encapsulation layer, and thus the stress condition at the edge of the thin film encapsulation layer in the foldable module cannot be analyzed accurately enough. The edge of the thin film encapsulation layer is a part that may cause a failure in the film encapsulation layer. According to the present embodiment, a stress detection portion is provided at the edge of the thin film encapsulation layer, and the edge of the thin film encapsulation layer is covered by the stress detection portion with upper and lower layers. The strain of the edge portion of the thin film encapsulation layer is evaluated by measuring the change in the metal resistor. The end surface of the thin film encapsulation layer is wrapped by the stress detection portion, i.e., the stress detection portion covers the upper and lower side surfaces and the end surface connected between the side surfaces of the thin film encapsulation layer. In this way, the stress of the thin film encapsulation layer can be more comprehensively monitored. In addition, since the edges of the display panel are relatively fragile and stress concentration is likely to occur at the edges of the display panel, a crack invasion path may be produced at the edges. In present disclosure, a part of the stress detection portion is located outside the thin film encapsulation layer, a part of the stress detection portion extends to overlap with the thin film encapsulation layer. The part of the stress detection portion overlapping with the thin film encapsulation layer is in contact with the thin film encapsulation layer. Therefore, the extension path of the stress detection portion can simulate a crack path, and a crack condition or a risky area can be obtained immediately, thereby obtaining more accurate detection results. In addition, the stress detection portion itself has an effect of preventing cracks. The structure of the stress detection portion wrapping the end of the thin film encapsulation layer, in combination with an insertion of the stress detection portion, strengthens the encapsulation structure and improves the encapsulation reliability.

Figure 6:
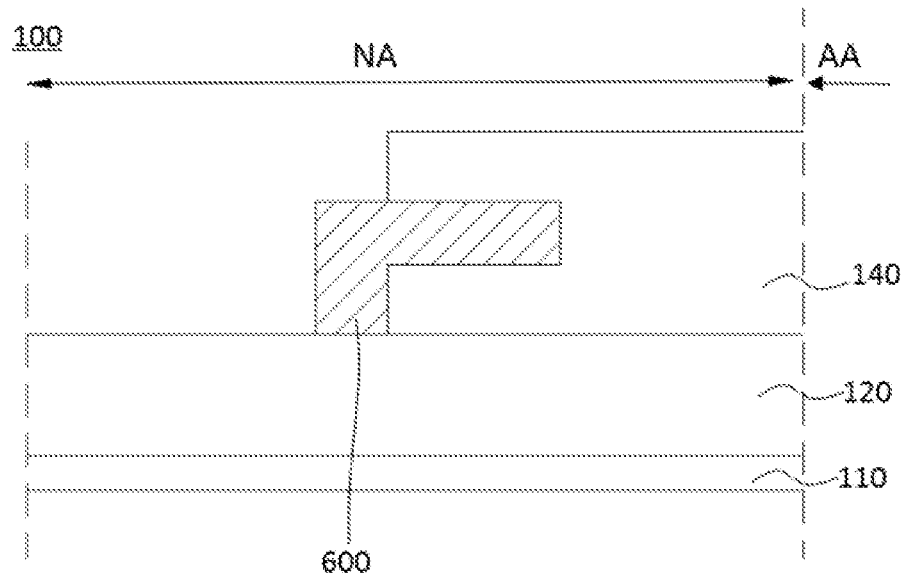
FIG. 6 is a schematic cross-sectional view of yet another display panel according to an embodiment of the present disclosure.

FIG. 6 is a schematic cross-sectional view of another display panel according to an embodiment of the present disclosure.

The embodiment shown in FIG. 6 differs from the above embodiments in that the stress detection portion 600 is inserted into the thin film encapsulation layer 140. That is, both the upper and lower surfaces of the stress detection portion 600 are partially in contact with the thin film encapsulation layer 140.

In an embodiment, the thin film encapsulation layer 140 includes at least one inorganic layer, and the stress detection portion 600 is at least partially inserted into the inorganic layer from an end surface of the inorganic layer, such that both the upper and lower surfaces of the stress detection portion 600 are in contact with the inorganic layer. In an embodiment, the inorganic layer is formed as one piece.

According to this embodiment, the stress detection portion is provided on the edge of the thin film encapsulation layer, and the strain condition of the edge portion of the thin film encapsulation layer is evaluated using the stress detection portion. In addition, a part of the stress detection portion is located outside the thin film encapsulation layer, a part of the stress detection portion extends to overlap with the thin film encapsulation layer, and the part of the stress detection portion overlapping with the thin film encapsulation layer contacts the thin film encapsulation layer. Therefore, the extension path of the stress detection portion can simulate the crack path, and the crack condition or the stress condition in the risky area can be obtained immediately, thereby obtaining more accurate detection results. Since the stress detection portion itself has the function of preventing cracks and has the inserted portion, the encapsulation structure can be strengthened and the encapsulation reliability can be enhanced. In addition, since the stress detection portion is at least partially inserted into the inorganic film layer from the end surface of the one-piece inorganic film layer, an effective detection area of the stress detection portion is sufficiently increased.

Figure 7:
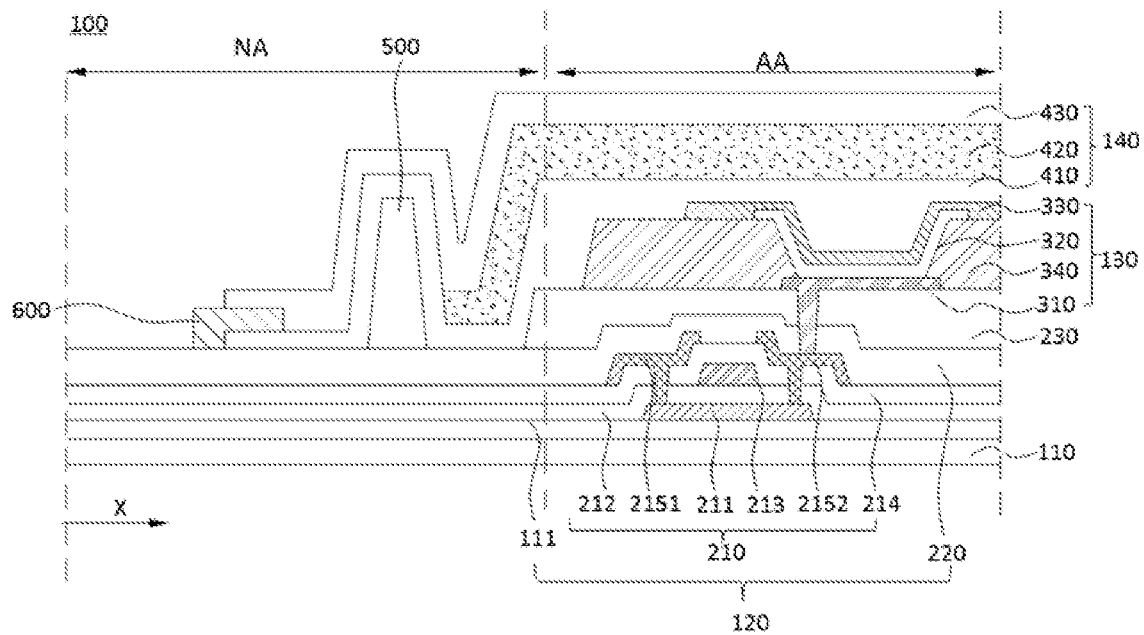
FIG. 7 is a cross-sectional view of yet another display panel taken along A-A in FIG. 1 according to an embodiment of the present disclosure.

In some other embodiments, the stress detection part 600 is not limited to be inserted into a certain layer in the thin film encapsulation layer. The stress detection portion 600 may be inserted between two layers of the thin film encapsulation layer, as shown in FIG. 7. FIG. 7 is a cross-sectional view of another display panel taken along A-A in FIG. 1 according to an embodiment of the present disclosure.

The thin film encapsulation layer 140 includes a first inorganic encapsulation layer 410, a first organic encapsulation layer 420, and a second inorganic encapsulation layer 430, which are sequentially disposed in the direction facing away from the substrate 110.

As shown in FIG. 7, the stress detection portion 600 extends between the first inorganic encapsulation layer 410 and the second inorganic encapsulation layer 430 from a position where the end surface of the first inorganic encapsulation layer 410 is bounded on the end surface of the second inorganic encapsulation layer 430. That is, the upper and lower surfaces of the stress detection portion 600 that are partially overlapping with the thin film encapsulation layer 140 are in contact with the first inorganic encapsulation layer 410 and the second inorganic encapsulation layer 430, respectively.

According to this embodiment, the stress detection portion is used to evaluate the strain of the edge portion of the thin film encapsulation layer, and a pinned structure is formed with the insertion of the stress detection portion, which strengthens the encapsulation structure and improves encapsulation reliability. In addition, the stress detection portion is at least partially inserted into an interface between the inorganic film layers from the end interface of the adjacent inorganic layers, which sufficiently increases the effective detection area of the stress detection portion. In this way, the stress between different sub-layers can be detected, the strain between the sub-layers can be monitored, and cracks are prevented from extending between the sub-layers.

Figure 8:
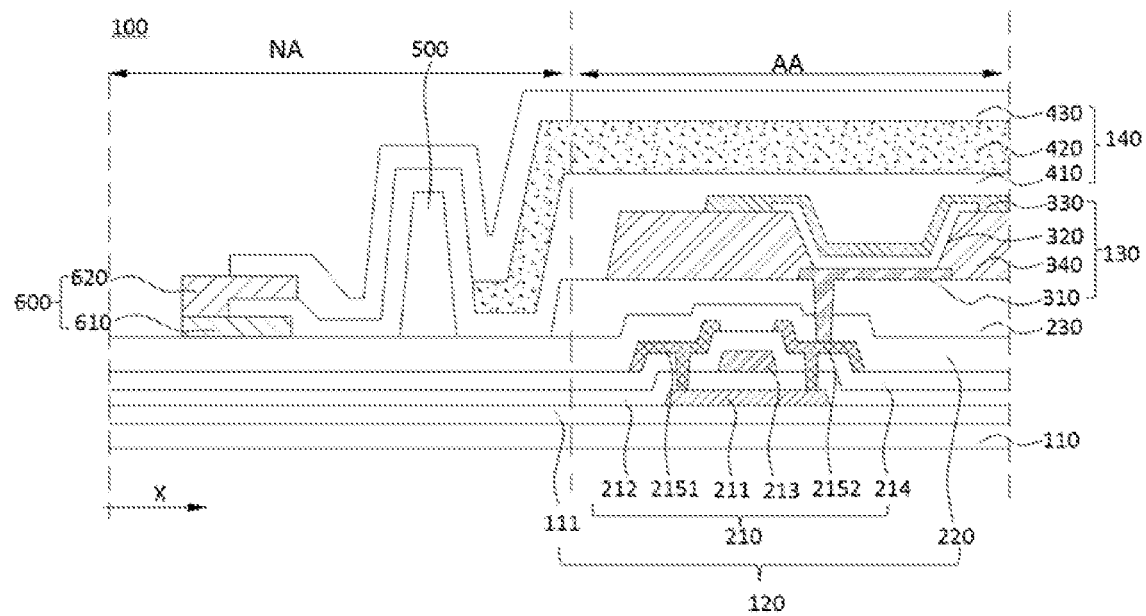
FIG. 8 is a schematic cross-sectional view of yet another display panel according to an embodiment of the present disclosure.
Figure 9:
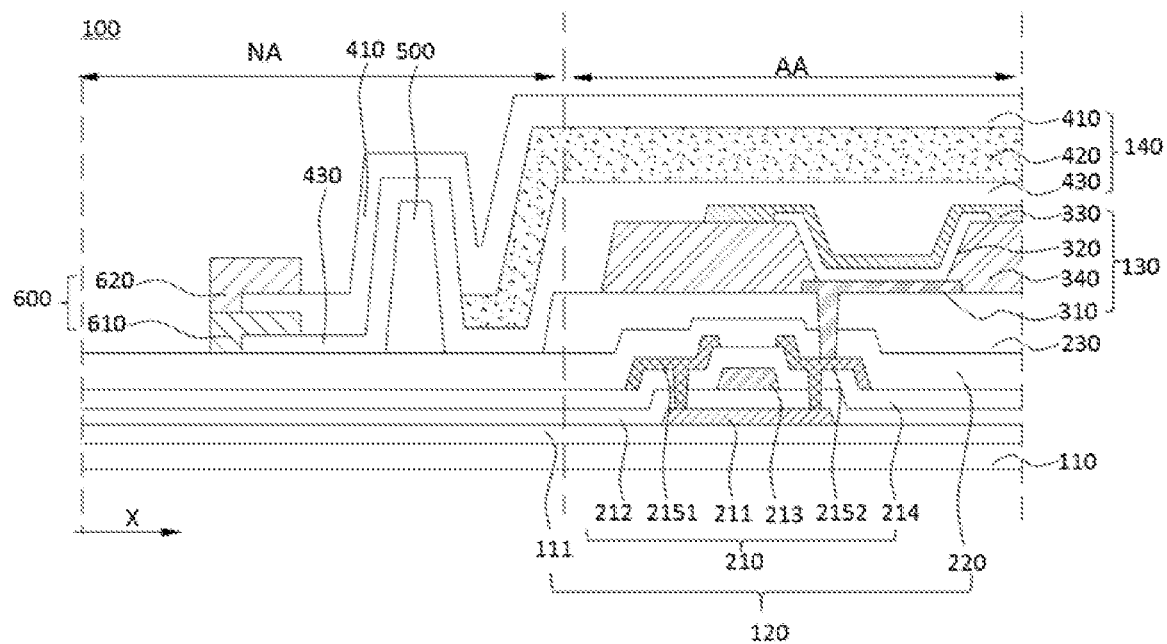
FIG. 9 is a schematic cross-sectional view of yet another display panel according to an embodiment of the present disclosure.

FIGS. 8 and 9 are each a schematic cross-sectional view of another display panel according to an embodiment of the present disclosure.

In some embodiments of the present disclosure, as shown in FIGS. 8 and 9, the thin film encapsulation layer 140 includes a first inorganic encapsulation layer 410.

The first detection sub-portion 610 and the second detection sub-portion 620 are located on two side surfaces of the first inorganic encapsulation layer 410, respectively. That is, the detection sub-portions are provided on both sides of each sub-layer of the thin-film encapsulation layer. In this way, the stress detection section is provided on the edge of the thin film encapsulation layer, and the edge of the thin film encapsulation layer is covered by the stress detection sections on upper and lower layers. The strain of the edge of the thin film encapsulation layer is evaluated by measuring the change in metal resistor. Moreover, the stress detection portion wraps the end surface of the thin film encapsulation layer, i.e., the stress detection portion covers the upper and lower side surfaces of the thin film encapsulation layer and the end surface connected between the side surfaces. In this way, the stress of the thin film encapsulation layer can be more comprehensively monitored. In addition, since the edges of the display panel are relatively fragile and stress concentration is more likely to occur at the edges of the display panel, a crack extension path may be produced at the edges. In this embodiment, a part of the stress detection portion is located outside the thin film encapsulation layer, another part of the stress detection portion extends to overlap with and to contact the thin film encapsulation layer. Therefore, the extension path of the stress detection portion can simulate a crack path, and a crack condition or stress conditions in a risky area can be obtained earlier, thereby obtaining more accurate detection results. In addition, the stress detection portion itself has a function of preventing cracks. The structure of the stress detection portion wrapping the end of the thin film encapsulation layer, in combination with the insertion of the stress detection part, strengthens the encapsulation structure and enhances the encapsulation reliability.

In an embodiment, the thin film encapsulation layer 140 further includes a second inorganic encapsulation layer 430 located on a side of the first inorganic encapsulation layer 410 facing away from the second detection sub-portion.

In this way, the stress condition on the edge of the thin film encapsulation layer can be accurately detected. Further, the stress detection portion is inserted into the inorganic layer. As described above, the material of the stress detection portion itself has a function of preventing cracks in the encapsulation layer. The detection sub-portions and the sub-layers of the thin film encapsulation layer (e.g., in the present embodiment, the first inorganic encapsulation layer 410 and the second inorganic encapsulation layer 430) are stacked in an alternative manner so as to form a pinned structure. Therefore, the edges of the sub-layers of the thin film encapsulation layer are more firmly bound to the array layer through the detection sub-portions, thereby improving the structural stability and preventing the crack by the pinned structure.

It can be understood that, in the present embodiment, one stress detection portion includes two detection sub-portions, for example, the first detection sub-portion 610 and the second detection sub-portion 620. However, a number of the detection sub-portions is not limited to two. For example, in other embodiments of the present disclosure, one stress detection portion may include any odd number of or any even number of detection sub-portions, such as three, or four sub-portions, and the number of the detection sub-portions may be set according to the number of inorganic layers in the thin film encapsulation layer. Further, the detection sub-portions are located between different layers, and are alternately pinned with the inorganic sub-layers of the thin film encapsulation layer.

It should be noted that the different layers of the detection sub-portions referred to that the detection sub-portions are pinned between different layers or on layer interfaces of the thin film encapsulation layer. The pinned structure can be understood as a nail extending to a region overlapping with and in contact with the thin film encapsulation layer from a region outside the thin film encapsulation layer and not overlapping with the thin film encapsulation layer. In other words, a part of one detection sub-portion is located in the coverage region of the thin film encapsulation layer and is in contact with the thin film encapsulation layer, while another part of the one detection sub-portion is located outside the thin film encapsulation layer. The detection sub-portions of different layers contact each other outside the thin film encapsulation layer.

Further, as shown in FIG. 8, the second inorganic encapsulation layer is located on a side of the first inorganic encapsulation layer facing away from the display layer. That is, the first inorganic encapsulation layer 410, the first organic encapsulation layer 420, and the second inorganic encapsulation layer 430 are sequentially disposed in the direction facing away from the substrate 110. In this way, an upper surface of a part of the first detection sub-portion 610 overlapping with the thin film encapsulation layer 140 and an upper surface of a part of the second detection sub-portion 620 overlapping with the thin film encapsulation layer 140 are both covered by the sub-layers of the thin film encapsulation layer 140.

In an embodiment, the first inorganic encapsulation layer 410 is a layer in the thin film encapsulation layer 140 closest to the display layer 130.

In the present embodiment, on the basis of the pinned effect, the first detection sub-portion 610 and the second detection sub-portion 620 can be fully utilized in such a manner that the upper surfaces of the two detection sub-portions are covered by the sub-layers of the thin film encapsulation layer 140, and the lower surface of the first detection sub-portion 610 may be in contact with the array layer. In this way, the first detection sub-portion 610 and the second detection sub-portion 620 can fully detect the stress at the interfaces of the layers, and the detection path thereof can more realistically simulate the crack path.

Another embodiment shown in FIG. 9 differs from the above embodiments in that the first inorganic encapsulation layer is a layer farthest from the display layer in the thin film encapsulation layer. That is, the second inorganic encapsulation layer 430, the first organic encapsulation layer 420, and the first inorganic encapsulation layer 410 are sequentially disposed in the direction facing away from the substrate 110. In addition, one of the first detection sub-portion 610 and the second detection sub-portion 620 is located on a side of the entire thin film encapsulation layer 140 facing away from the display layer 130.

Figure 10:
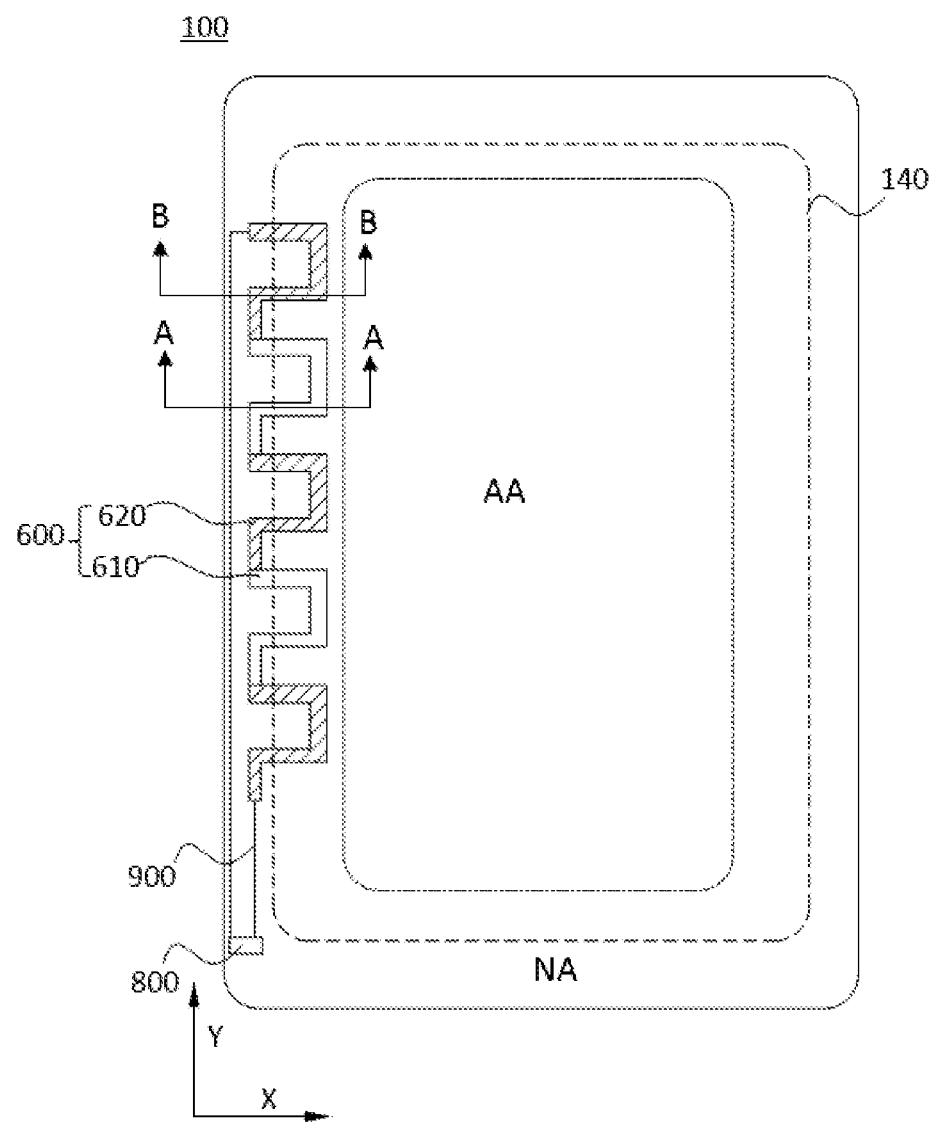
FIG. 10 is a top view of another organic light-emitting display panel according to an embodiment of the present disclosure.
Figure 11:
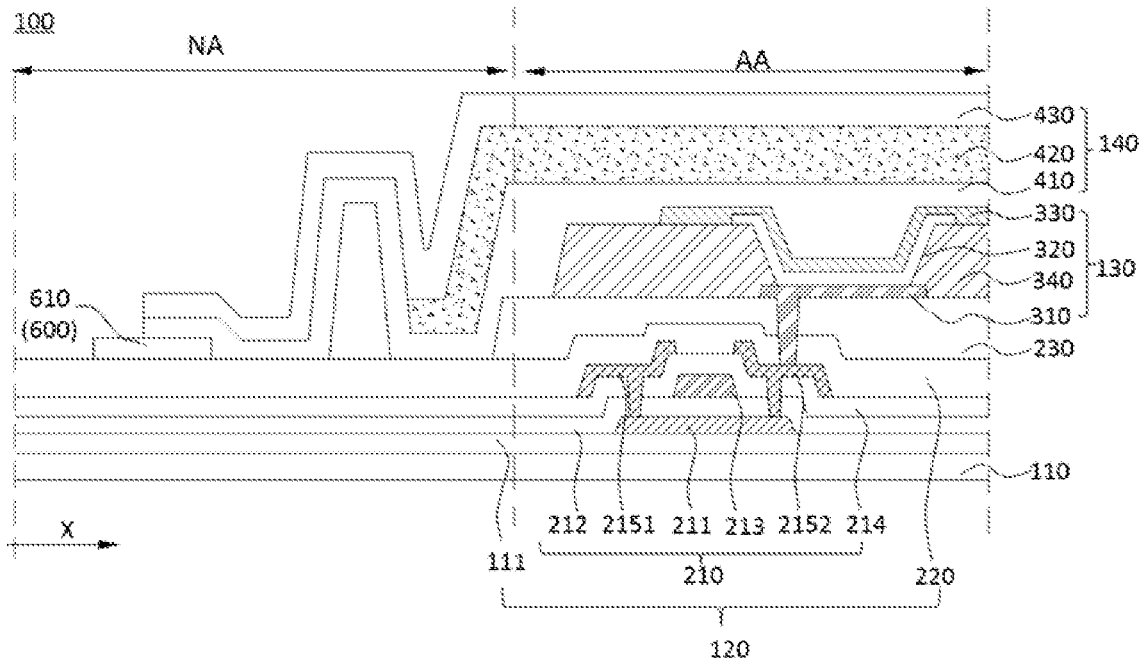
FIG. 11 is a cross-sectional view of another display panel taken along A-A in FIG. 10 according to an embodiment of the present disclosure.
Figure 12:
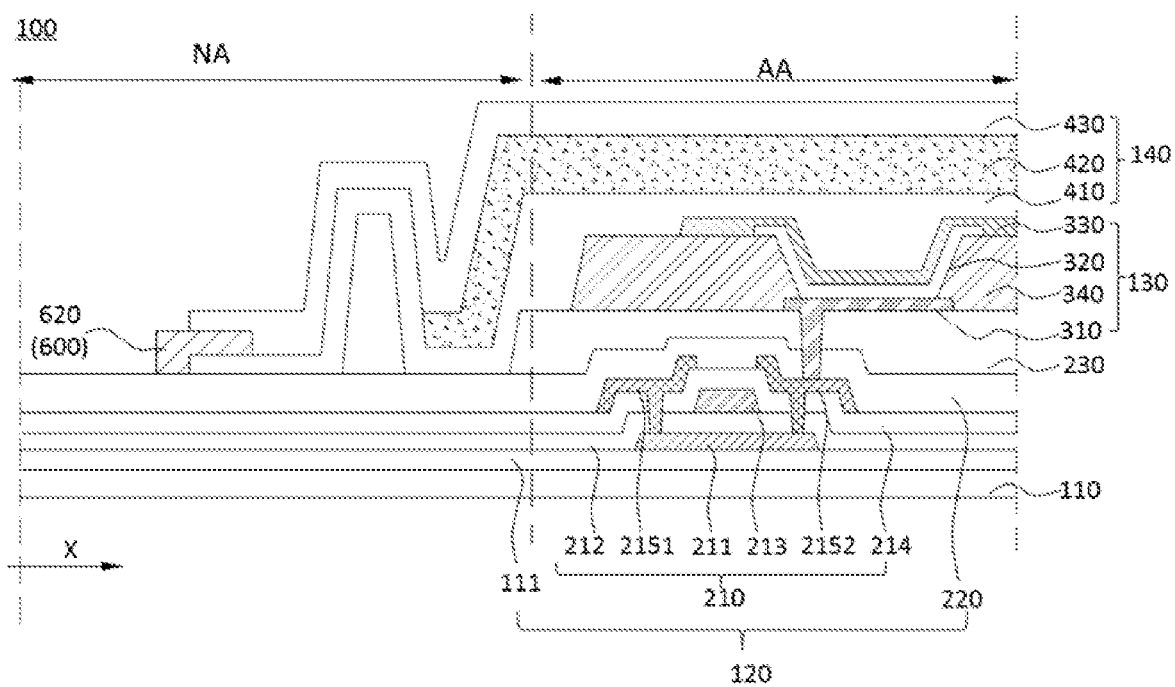
FIG. 12 is a cross-sectional view of another display panel taken along B-B in FIG. 10 according to an embodiment of the present disclosure.

FIG. 10 is a top view of another organic light-emitting display panel according to an embodiment of the present disclosure, FIG. 11 is a cross-sectional view of the display panel taken along A-A in FIG. 10 according to an embodiment of the present disclosure, and FIG. 12 is a cross-sectional view of the display panel taken along B-B in FIG. 10 according to an embodiment of the present disclosure.

Referring to FIG. 10 to FIG. 12, the first detection sub-portions 610 and the second detection sub-portions 620 are connected in series, and the first detection sub-portions 610 and the second detection sub-portions 620 are arranged alternately along an edge of the thin film encapsulation layer 140. Since the first detection sub-portions 610 and the second detection sub-portions 620 are located in different layers, the stress detection portion 600 can be formed by separate wirings, and the stress detection portion 600 can monitor stresses or crack conditions of the different layers at the edge of the thin film encapsulation layer 140 simultaneously. In addition, due to the design of the separate wirings, the cracks can be prevented from extending, so as to avoid the case where the first detection sub-portion 610 and the second detection sub-portion 620 break earlier than the edge of the thin film encapsulation layer 140.

In an embodiment, both the first detection sub-portion 610 and the second detection sub-portion 620 are strip detection sections, and they are connected through ends of the strip detection sections.

The two ends of the strip detection sections are located in the region not overlapping with the thin film encapsulation layer 140.

The strip detection section is in a bending shape protruding towards the thin film encapsulation layer 140, such that the strip detection section partially overlaps with the thin film encapsulation layer.

In other words, the strip first detection sub-portion 610 and the strip second detection sub-portion 620 extend into the thin film encapsulation layer 140 from the respective ends thereof located in the region not overlapping with the thin film encapsulation layer 140, so as to overlap with and contact the thin film encapsulation layer 140. In this way, the first detection sub-portion 610 and the second detection sub-portion 620 respectively form the bending shape. According to the present embodiment, the first detection sub-portion 610 and the second detection sub-portion 620 can be more closely arranged along the edge of the thin film encapsulation layer, in order to more comprehensively cover the detection points. In the meantime, the stresses generated by the first detection sub-portion 610 and the second detection sub-portion 620 themselves are reduced to improve detection accuracy.

Figure 13:
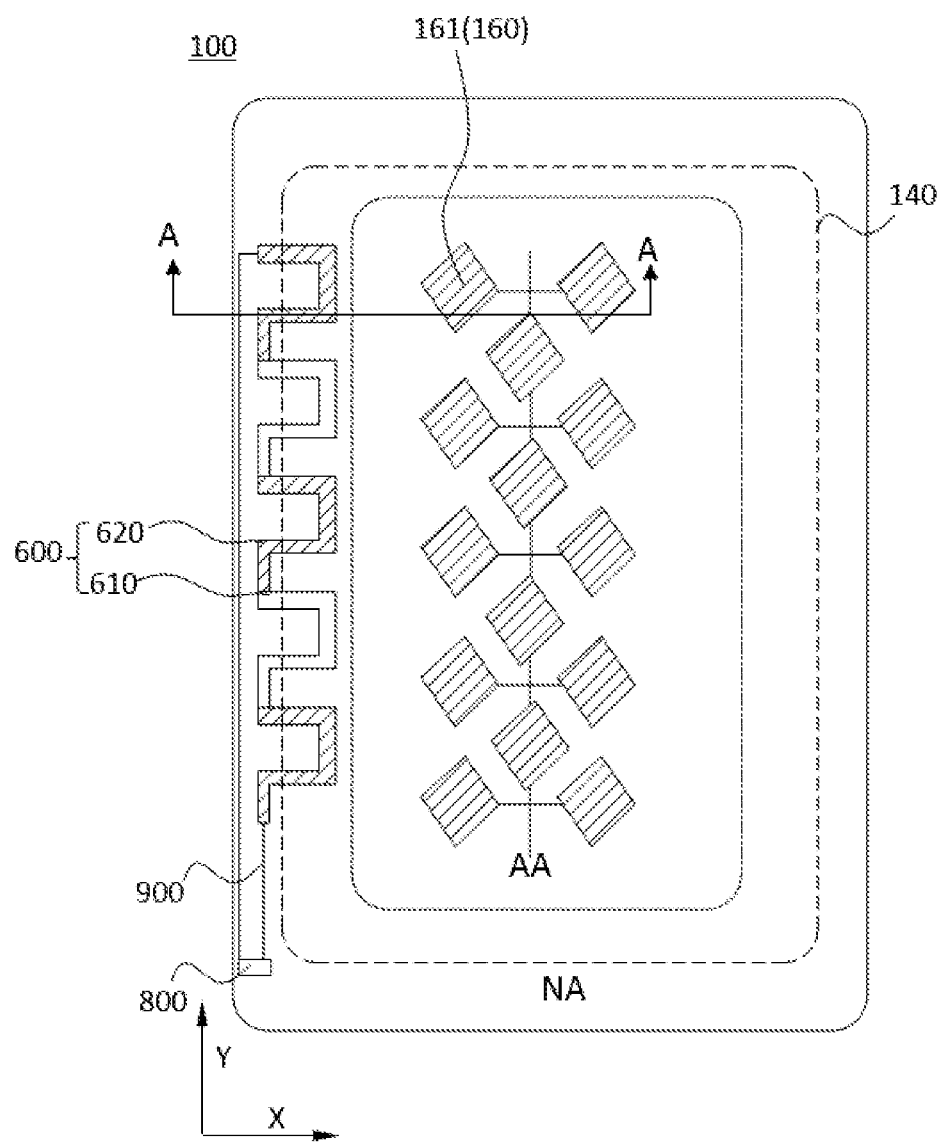
FIG. 13 is a top view of another organic light-emitting display panel according to an embodiment of the present disclosure.
Figure 14:
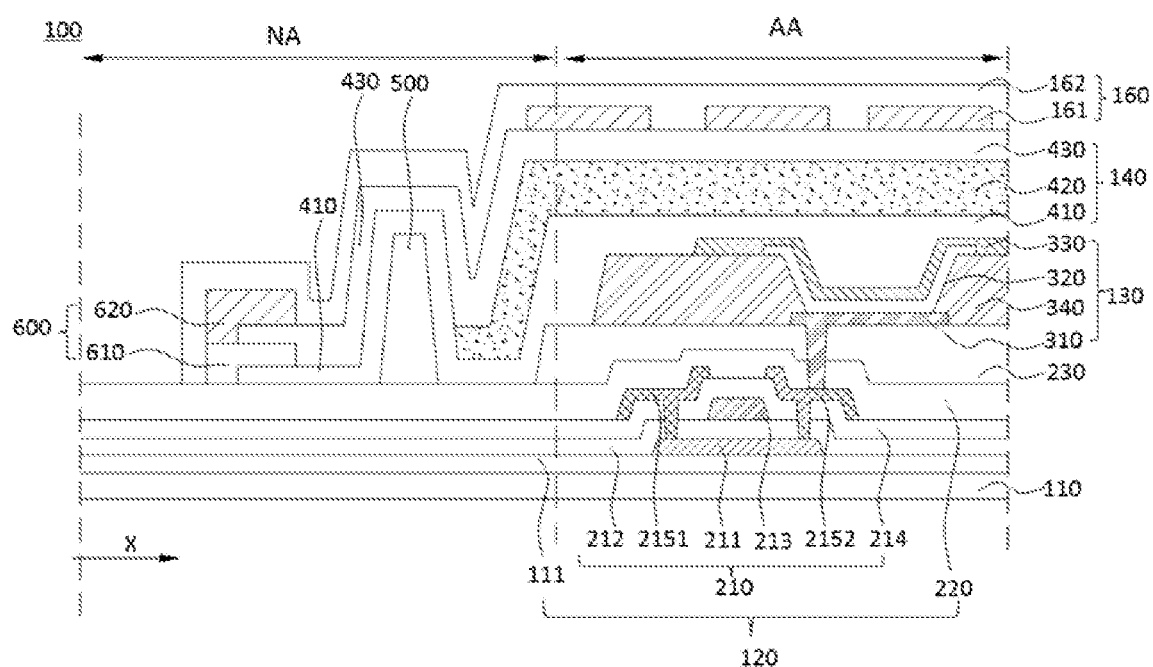
FIG. 14 is a cross-sectional view of another display panel taken along A-A in FIG. 10 according to an embodiment of the present disclosure.

FIG. 13 is a top view of another organic light-emitting display panel according to an embodiment of the present disclosure; and FIG. 14 is a cross-sectional view of another display panel taken along A-A in FIG. 10 according to an embodiment of the present disclosure. Referring to FIGS. 13 to 14, the display panel 100 further includes a touch function layer 160 located on a side of the thin film encapsulation layer 140 facing away from the display layer 130. At least a part of the stress detection portion 600 is located in the same layer and made of the same material as the touch function layer 160.

For example, the touch function layer 160 is located on a side surface of the second inorganic encapsulation layer 430 facing away from the first organic encapsulation layer 420. The touch function layer 160 includes a touch electrode layer 161 and an insulation layer 162 which are sequentially stacked.

In an embodiment, the touch electrode layer 161 includes a touch driving electrode and a touch sensing electrode to form a touch function layer of mutual capacitance. The touch electrodes are directly formed on the second inorganic encapsulation layer 430, which is used as a carrier substrate. That is, the touch structure in this embodiment is an on-cell.

In an embodiment, the touch electrode layer 161 may be made of a metal material, for example, it may be a metal mesh.

Although the two types of electrodes are located in the same layer in this embodiment, it is also possible in other embodiments of the present disclosure that a second touch electrode layer may be provided on a side of the insulation layer 162 facing away from the touch electrode layer 161. In other embodiments of the present disclosure, the touch electrode may be a self-capacitance touch electrode, which is not described in detail herein.

At least a part of the stress detection portion 600 is located in the same layer and made of the same material as the touch function layer 160. For example, in this embodiment, the stress detection portion 600 includes a first detection sub-portion 610 and a second detection sub-portion 620 that are located in different layers. The second detection sub-portion 620 is located on a side of the thin film encapsulation layer 140 facing away from the display layer 130. The second detection sub-portion 620 and the touch electrode layer 161 are located in the same layer and are made of the same material, that is, they are formed in the same step using the same material.

In this embodiment, the thickness of the display panel is reduced, the manufacturing process is simplified, and the cost is reduced. Further, since at least a part of the stress detection portion 600 is also formed by using the same material and the same process as the touch function layer 160, it is possible to detect the influence of the touch film layer on the thin film encapsulation layer, thereby achieving a comprehensive detection.

Figure 15:
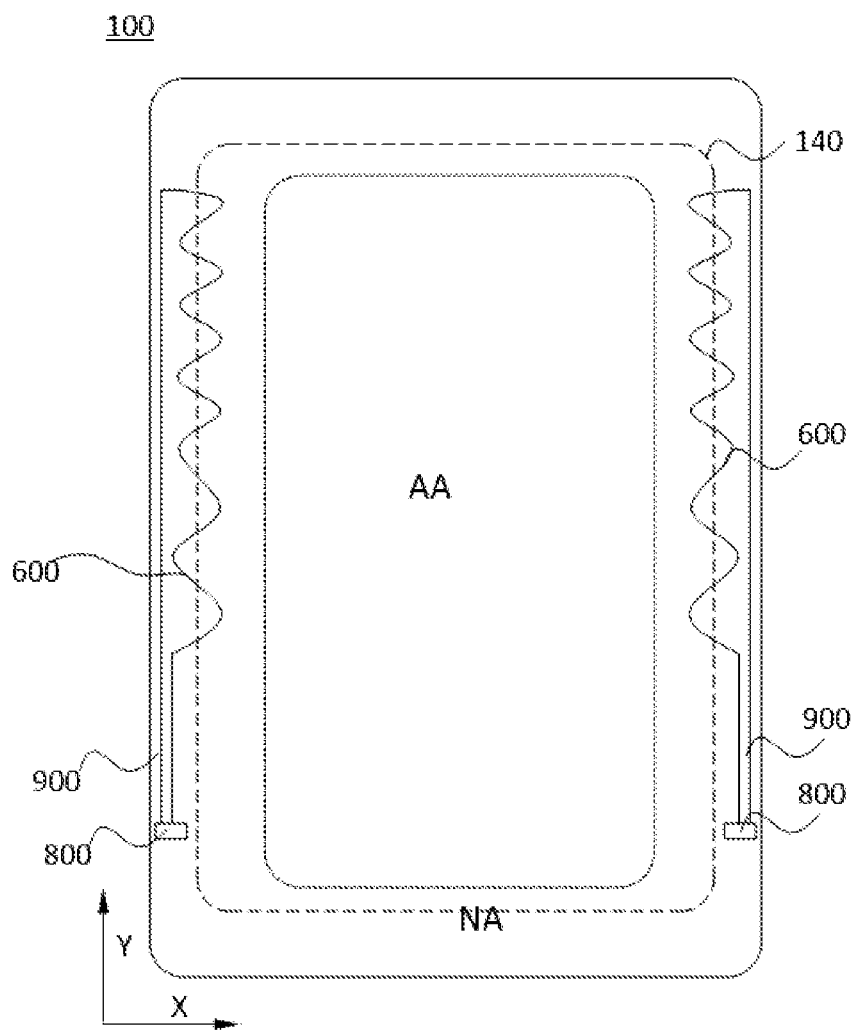
FIG. 15 is a top view of another display panel according to an embodiment of the present disclosure.
Figure 16:
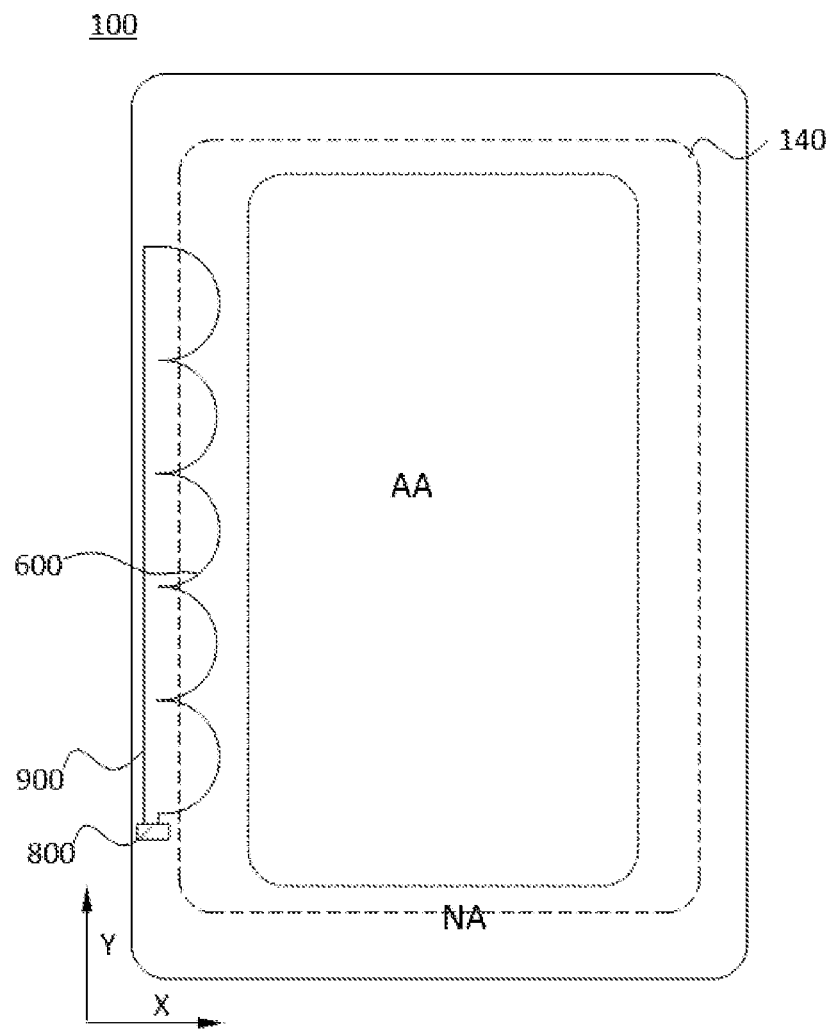
FIG. 16 is a top view of another display panel according to an embodiment of the present disclosure.
Figure 17:
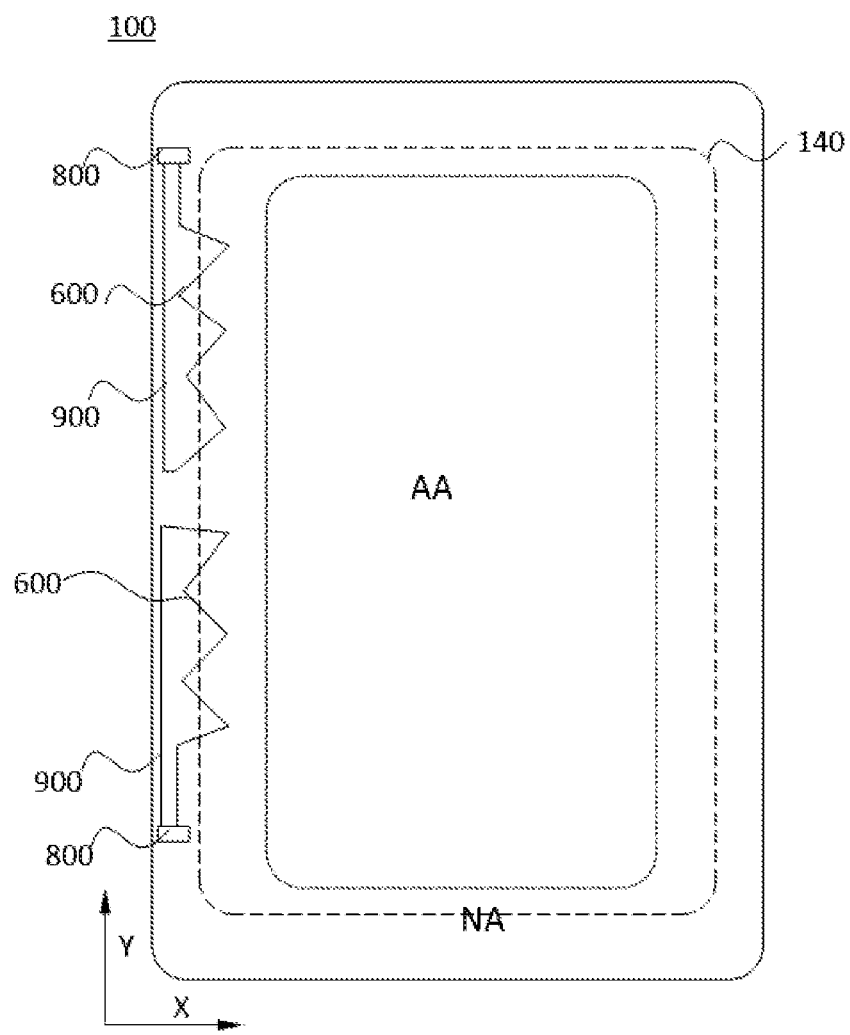
FIG. 17 is a top view of another display panel according to an embodiment of the present disclosure.

FIG. 15 to FIG. 17 are top views of display panels provided by embodiments of the present disclosure. In some embodiments, the orthographic projection of the stress detection portion 600 on the substrate may have a shape a polygonal line, a wavy line, a sinusoidal line, a serpentine line, or a combination thereof; where an overall trend direction of the stress detection portion 600 is consistent with an extending direction of the edge of the thin film encapsulation layer 140.

It should be understood that the above-mentioned trend direction is perpendicular to a protruding direction of the polygonal line, the wavy line, the sinusoidal line or the serpentine line. For example, in terms of the sinusoidal line, the overall trend direction of the sinusoidal line is perpendicular to its peaking direction; in terms of the wavy line, the overall trend direction of the wavy line is perpendicular to its undulating direction.

In some alternative embodiments, the display panel 100 further includes a control unit 800 and a signal line 900 located outside the thin film encapsulation layer 140. That is, the control unit 800 is located outside the region covered by the thin film encapsulation layer 140.

In an embodiment, the signal line 900 may be obtained by patterning a layer having a conductive function in the array layer 120. That is, the position of the signal line 900 may not overlap with the thin film encapsulation layer 140.

The stress detection portion 600 is electrically connected to the control unit 800 through the signal line 900. The control unit 800 is configured to provide a detection signal to the stress detection portion 600, and to receive and possibly analyze an output signal fed back from the stress detection portion 600.

It can be understood that the embodiments of the present application only illustrate one stress detection portion 600 and one control unit 800, but the number of the stress detection portion and the number of the control units are not specifically limited in the present disclosure. The number of the stress detection sections and the number of the control units may be selected as required for a particular embodiment. In addition, the stress detection portions in the present disclosure may be located on different sides of the display area of the display panel.

Figure 18:
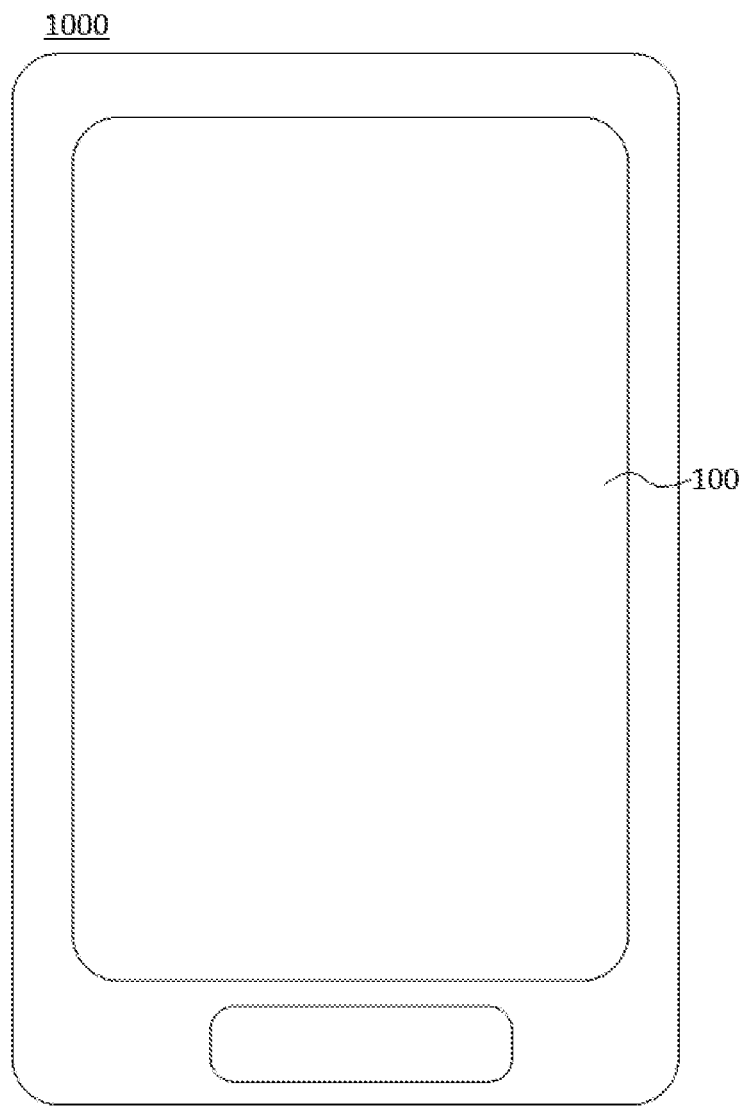
FIG. 18 is a schematic structural diagram of a display apparatus according to an embodiment of the present disclosure.

The present disclosure further provides a display apparatus including the display panel provided by the present disclosure. FIG. 18 is a schematic structural diagram of a display apparatus according to an embodiment of the present disclosure. As shown in FIG. 18, the display apparatus 1000 includes the display panel 100 provided by any one of the above embodiments of the present disclosure. FIG. 18 merely illustrate a mobile phone as an example of the display apparatus 1000. It can be understood that the display apparatus of the present disclosure may be a computer, a television, a vehicle display apparatus, or other apparatuses having a display function, which is not limited herein. The display apparatus provided by the embodiment of the present disclosure has the same beneficial effects as the display panel provided by the embodiments of the present disclosure, which can be referred to the specific description of the display panel in the foregoing embodiments and are not repeated herein.

The above is a detailed description of the present disclosure in combination with specific preferred embodiments, but the present disclosure is not limited thereto. The deductions or replacements made by those skilled in the art without deviating from the inventive technology should all fall within the protection scope of the present disclosure.

What is claimed is:

1. A display panel, comprising:
    a substrate;
    an array layer located on the substrate;
    a display layer located on a side of the array layer facing away from the substrate, the display layer comprising light-emitting components;
    a thin film encapsulation layer located on a side of the display layer facing away from the array layer; and
    at least one stress detection resistor,
    wherein each of the at least one stress detection resistor comprises a first part disposed outside the thin film encapsulation layer, and a second part overlapping with and in contact with the first part; and the thin film encapsulation layer is in contact with the first part and the second part, and wherein the thin film encapsulation layer is at least partially sandwiched between the first part and the second part.

2. The display panel according to claim 1, wherein each of the at least one stress detection resistor comprises a first detection sub-portion and a second detection sub-portion, and
    wherein the first detection sub-portion is located in a different layer from the second detection sub-portion.

3. The display panel according to claim 2, wherein the first detection sub-portion and the second detection sub-portion are connected in series, and
    the first detection sub-portion and the second detection sub-portion are alternately arranged along an edge of the thin film encapsulation layer.

4. The display panel according to claim 2, wherein the thin film encapsulation layer comprises a first inorganic encapsulation layer, and
    wherein the first detection sub-portion and the second detection sub-portion are located on two side surfaces of the first inorganic encapsulation layer, respectively.

5. The display panel according to claim 4, wherein the thin film encapsulation layer further comprises a second inorganic encapsulation layer located on a side of the first inorganic encapsulation layer facing away from the second detection sub-portion.

6. The display panel according to claim 5, wherein the second inorganic encapsulation layer is located on a side of the first inorganic encapsulation layer that is facing away from the display layer.

7. The display panel according to claim 6, wherein the first inorganic encapsulation layer is a film layer in the thin film encapsulation layer that is closest to the display layer.

8. The display panel according to claim 5, wherein the first inorganic encapsulation layer is a film layer in the thin film encapsulation layer that is farthest from the display layer.

9. The display panel according to claim 2, wherein the first detection sub-portion and the second detection sub-portion are located on two opposite side surfaces of the thin film encapsulation layer, respectively.

10. The display panel according to claim 2, wherein an orthographic projection of the first detection sub-portion and an orthographic projection of the second detection sub-portion both are strip sections, wherein the sub-portions are connected to each other through ends of the strip detection sections, wherein the ends of the strip detection sections are located in the region not overlapping with the thin film encapsulation layer, and
    wherein each of the strip detection sections has a bending shape protruding towards the thin film encapsulation layer in such a manner that each of the strip detection sections partially overlaps with the thin film encapsulation layer.

11. The display panel according to claim 1, further comprising a touch function layer located on a side of the thin film encapsulation layer facing away from the display layer,
    wherein at least a part of each of the at least one stress detection resistor is located in a same layer and made of a same material as the touch function layer.

12. The display panel according to claim 1, wherein an orthographic projection of each of the at least one stress detection resistor on the substrate has a shape of a polygonal line, a wavy line, a sinusoidal line, a serpentine line, or a combination thereof, and has an overall trend direction consistent with an extending direction of an edge of the thin film encapsulation layer.

13. The display panel according to claim 1, wherein the at least one stress detection resistor is inserted into the thin film encapsulation layer.

14. The display panel according to claim 1, wherein each of the at least one stress detection resistor is made of a metal material.

15. The display panel according to claim 1, wherein each of the at least one stress detection resistor is a brittleness detection resistor configured to, through a breakage thereof, reflect a crack of the thin film encapsulation layer and release a part of the stress concentrated on the thin film encapsulation layer.

16. The display panel according to claim 1, further comprising a control unit and a signal line that are located outside the thin film encapsulation layer,
    wherein the at least one stress detection resistor is electrically connected to the control unit through the signal line.

17. A display apparatus, comprising a display panel, the display panel comprising:
    a substrate;
    an array layer located on the substrate;
    a display layer located on a side of the array layer facing away from the substrate, the display layer comprising light-emitting components;
    a thin film encapsulation layer located on a side of the display layer facing away from the array layer; and
    at least one stress detection resistor,
    wherein each of the at least one stress detection resistor comprises a first part disposed outside the thin film encapsulation layer, and a second part overlapping with and in contact with the first part; and the thin film encapsulation layer is in contact with the first part and the second part, and wherein the thin film encapsulation layer is at least partially sandwiched between the first part and the second part.

* * * * *